United States Patent [19]

Chang et al.

[11] 4,392,148
[45] Jul. 5, 1983

[54] MOAT-GUARDED JOSEPHSON DEVICES

[75] Inventors: Wen H. Chang, Wappingers Falls; Tushar R. Gheewala, Yorktown Heights; Erik P. Harris, Somers, all of N.Y.

[73] Assignee: International Business Machines Corporation, Armonk, N.Y.

[21] Appl. No.: 221,862

[22] Filed: Dec. 31, 1980

[51] Int. Cl.³ ............................................. H01L 39/22
[52] U.S. Cl. .......................................... 357/5; 307/306
[58] Field of Search ........................... 357/5; 307/306; 324/248; 331/107 S

[56] References Cited
PUBLICATIONS

Geppert, *I.B.M. Tech. Discl. Bull.*, vol. 21, No. 10, Mar. 1979, p. 4295.
Mukherjie, *I.B.M. Tech. Discl. Bull.*, vol. 22, No. 9, Feb. 1980, p. 4261.
Jones, *I.B.M. Tech. Discl. Bull.*, vol. 21, No. 10, Mar. 1979, p. 4245.
Habermier, *I.B.M. Tech. Discl. Bull.*, vol. 22, No. 12, May 1980, p. 5489.
Landman et al., *I.B.M. Tech. Discl. Bull.*, vol. 17, No. 11, Apr. 1975, p. 3483.
Basavaiah et al., *I.B.M. Tech. Discl. Bull.*, vol. 20, No. 6, Nov. 1977.

*Primary Examiner*—Martin H. Edlow
*Attorney, Agent, or Firm*—Jackson E. Stanland

[57] ABSTRACT

In superconductive circuitry including a superconducting ground plane, a magnetic flux trapping moat is provided which surrounds a superconductive device. The moat is preferably a cut through the superconducting ground plane which extends along a perimeter surrounding the superconducting device, the moat being continuous except for small regions where there is no cut. The small regions serve as current carrying portions to link the ground plane within the moat to the rest of the ground plane outside of the moat. The moat is a flux pinning center so that magnetic flux does not enter the ground plane region located near the superconducting device. In a Josephson circuit, the Josephson tunnel devices are especially sensitive to trapped magnetic flux in the ground plane, and the provision of a moat around each of the devices prevents flux from moving into the ground plane areas near the devices and becoming trapped therein.

17 Claims, 2 Drawing Figures

MOAT-GUARDED JOSEPHSON DEVICES

DESCRIPTION

1. Technical Field

This disclosure relates to superconductive circuitry, and more particularly to superconductive circuitry which is susceptible to the presence of trapped magnetic flux, the invention relating to an improved technique for preventing flux trapping in the area of superconductive circuit devices.

2. Background Art

It is well known in the art that superconductive circuitry can be sensitive to stray magnetic fields. In particular, a superconductor has the capability of trapping magnetic flux vortices therein when it is cooled to superconducting temperatures. These trapped flux vortices affect the characteristics of the circuit devices, as for instance by shifting or distorting the switching characteristics of the devices.

In particular, logic and memory circuitry employing Josephson tunneling devices is very sensitive to the presence of magnetic fields. These circuits are generally fabricated using a continuous ground plane beneath the circuits and the presence of trapped flux in the ground plane is a difficult problem. In particular, certain types of Josephson devices, such as holey interferometers, are extremely sensitive to magnetic fields trapped in the ground planes. These holey interferometers are tunnel devices which are located over holes in the underlying ground plane. Since the holes are locations which provide pinning centers for trapping magnetic flux, there is a greater susceptibility to this problem in logic circuits employing holey interferometers.

The prior art has proposed several techniques for eliminating or reducing trapped magnetic flux in superconducting ground planes. For example, it is known to shield Josephson circuits using the technique shown in IBM Technical Disclosure Bulletin, Vol. 21, No. 10, March 1979, at Page 4295. In that reference, shielding is provided by superconducting cylinders which are used to form a loop in which the field is reduced.

Another technique for removing flux trapped in a superconducting material is that shown in IBM Technical Disclosure Bulletin, Vol. 22, No. 9, February 1980, at Page 4261. This technique uses a combination of heat and electrical current to move trapped fluxoids. The heat is applied to reduce the pinning force on the fluxoids and the electrical current is used to produce a Lorentz force on the unpinned fluxoids in order to move them.

Still another technique for detrapping flux in Josephson circuitry is described in IBM Technical Disclosure Bulletin, Vol. 21, No. 10, March 1979, at Page 4245. This technique uses a superconducting ground plane whose thickness is modulated. Interferometers are located over thick regions of the ground plane, since flux pinning forces in the thick regions will be less than in the thinner regions of the ground plane. Of course, such a ground plane may be difficult to fabricate. IBM Technical Disclosure Bulletin Vol. 22, No. 12, May 1980, Page 5489 describes the use of superconducting disks having notches on the peripheries thereof in order to provide a substantially flux-free region in an area located between two of these disks.

Another technique for reduction of shielding requirements involves segmenting the ground plane into a plurality of small ground planes. If the area of the ground plane is reduced, the maximum allowed perpendicular magnetic field of magnitude $\Phi_0/2A$, where $\phi_0$ is a flux quantum and A is the ground plane area, can be increased. Thus, the ambient magnetic field which must be shielded against is increased when the area is less, and therefore the magnetic shielding requirements are made less stringent.

The segmented ground plane approach has problems in that it is difficult to provide a common ground for all segments and, also, it is difficult to eliminate cross-talk between interconnections which cross the spaces between segments. The enhanced cross-talk is caused by the higher self and mutual inductances arising from the space between ground plane segments.

It would be advantageous to provide a simple technique for reducing the presence of trapped flux in the ground plane, and especially in the area of the superconducting devices most sensitive to that trapped flux. Accordingly, it is a primary object of this invention to provide an improved technique for preventing the occurrence of trapped flux in the ground plane, and especially in the area of sensitive superconductive devices.

It is another object of the present invention to provide a structure for preventing the occurrence of trapped flux in the ground plane in the area of Josephson tunneling devices fabricated over the ground plane.

It is another object of the present invention to provide a suitable technique for preventing the occurrence of adverse trapped flux in the ground plane of a superconductive circuit, in a manner which is an electrically favorable configuration.

It is a further object of the present invention to provide a technique for preventing the occurrence of trapped flux in a superconducting ground plane in a manner in which the electrical integrity of the ground plane can be maintained easily.

It is another object of the present invention to provide a technique for preventing the occurrence of trapped flux in a superconductive ground plane in an area sufficiently close to a flux sensitive device that adverse flux coupling does not occur between the trapped flux and the device.

It is another object of the present invention to provide circuitry using Josephson superconductive tunneling devices, where the flux sensitive devices of said circuit are located near regions of the ground plane having a moat therearound for preventing the occurrence of trapped flux in the area of the ground plane within the moat.

DISCLOSURE OF THE INVENTION

The practice of this invention involves a simple technique for creating favorable pinning sites for trapped fluxoids in the ground plane which are not in close proximity to the superconductive devices. A moat is provided in the ground plane, where the moat is typically a recess cut into the ground plane and which substantially surrounds a superconductive device constructed within the area enclosed by the moat. This narrow cut through the ground plane is continuous except for small connecting pieces of ground plane. For example, one connecting ground plane piece could be located under the gate current lead to a superconductive device, such as an interferometer.

Since there are small connecting pieces of ground plane joining the ground plane within the moat to that outside of the moat, return paths for electrical currents are provided. Additionally, while the patch of ground plane under a device is not completely isolated from the remainder of the superconducting chip ground plane, magnetic flux can enter the patch only through the small connecting pieces of ground plane. Since the width of these connections can be quite small compared to the moat perimeter, the possibility of flux getting past the moat and into the ground plane areas near the superconducting devices is small.

As an alternative, the moat can be an ion implanted or otherwise doped band in the ground plane which surrounds the device or can be an insulating band in the ground plane. If the critical temperature of the moat is less than that of the ground plane, a favorable flux trapping site will be provided.

These and other objects, advantages, and features will be apparent from the following more particular description of the preferred embodiments.

BEST MODE FOR CARRYING OUT THE INVENTION

Figure 1:
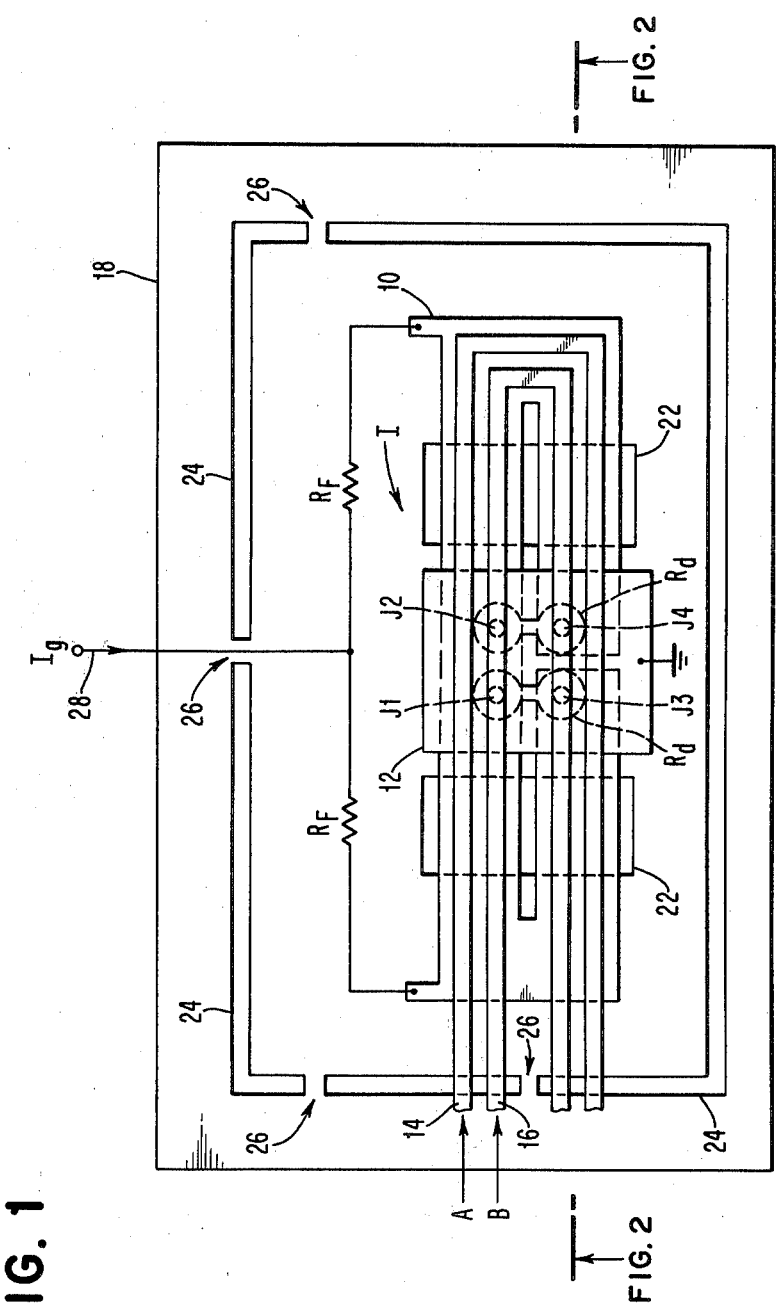
FIG. 1 is a top view of the superconductive circuitry including a three-junction interferometer located over a ground plane having holes in the vicinity of the interferometer, and a moat substantially surrounding the device area comprising the interferometer.
Figure 2:
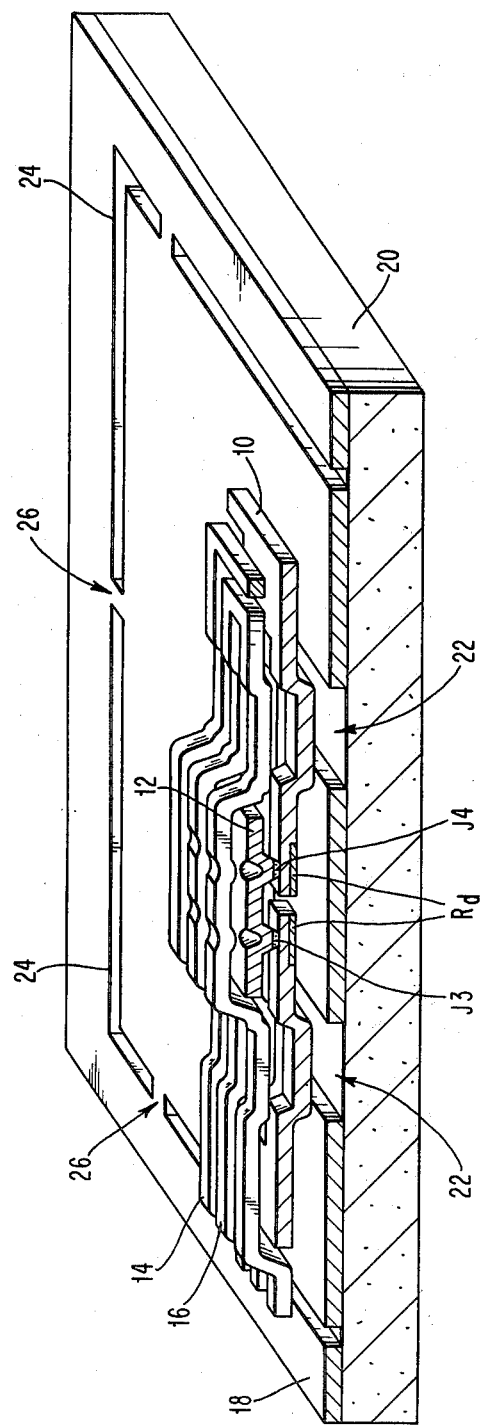
FIG. 2 is a sectional perspective view of the structure of FIG. 1, taken along line 2—2, which illustrates the various layers of the superconductive device and the surrounding moat.

FIGS. 1 and 2 show a top view of a superconductive circuit and a sectional vertical structure of that circuit. In this case, the circuit is a Josephson interferometer, and more particularly a holey interferometer. The circuit itself is described in more detail in an article by T. R. Gheewala which appeared in the IBM Journal of Research and Development, Vol. 24, No. 2, March 1980, at Page 130. The actual circuit is shown in FIG. 6 thereof, and described on Pages 133 and 134. Reference can be made to the article for a more complete understanding of the interferometer and its operation.

The interferometer I is comprised of a plurality of junctions indicated by the small dashed circles J1, J2, J3, and J4. Damping resistors $R_d$ are located below the junctions J1–J4. A base electrode 10 provides the gate current $I_g$ through resistors $R_F$ to the tunnel junctions. A counterelectrode 12 is located over the tunnel junctions as are control lines 14 and 16. The control lines are used to provide currents A and B for affecting the state of the interferometer, in a manner well known in the art. The interferometer is located over a superconducting ground plane 18, which is typically niobium. The entire structure is located over silicon substrate 20. Holes 22 are provided in the ground plane for the interferometer. As is known in the art, the loop inductance of the interferometer is formed mainly by the base electrode 10 which passes over holes 22 in the ground plane to increase its inductance per unit length. This reduces the size of the interferometer and its parasitic capacitance to the ground plane. Although the ground plane holes 22 provide electrical and real estate benefits, they also have disadvantages. For example, they provide preferred sites where ambient magnetic flux can be trapped when the ground plane is cooled below its critical temperature to make it superconducting. This in turn would distort the threshold curve and cause inadvertent switching of the interferometer. Thus, a holey interferometer circuit of the type pictured here is very susceptible to trapped flux.

In order to minimize the possibility of trapped flux in the holes 22 beneath the interferometer, or within the general area of the interferometer or any other circuit device, a moat 24 is located around the interferometer. Moat 24 is a band of material (or the absence of material, i.e., a cut) having a lower $T_c$ than that of the surrounding ground plane. A cut is shown for ease of illustration, but it should be understood that moat 24 is a narrow band which surrounds the circuit device and which can have several forms.

The moat cut is through the superconducting ground plane and is almost continuous, except for the small regions 26. These small regions of superconducting ground plane provide a ground electrical connection for the patch of superconducting ground plane under the interferometer, and also reduce cross-talk between the gate line 28 and the control lines 14 and 16. Only cross-talk between the control lines 14 and 16, where they cross moat 24, need be considered. Calculations show that, even when the moat is continuous under the control lines, this cross-talk is exceedingly small. $M/2Z_0$, where M is the mutual inductance between the current carrying control lines and $Z_0$ is the control line impedance, is of the order of 0.1 psec. Hence, the cross-talk disturb ratio $\Delta i/i$ is less than 1%. The added self inductance of the control lines due to the most crossing is only 2–3 pH. Hence, the presence of the moat causes a negligible effect on the high speed electrical characteristics of the interferometer, or any other device or circuit located within the moat.

The coupling between trapped flux within the moat and the interferometer loops is very small, being about 0.28%. This compares with about 40% for flux trapped in the holes 22 under the device.

The minimum width of the cut comprising the moat is approximately the coherence length of the material comprising the ground plane, which is the range of lengths over which the superconductivity can vary. It is approximately the size of the core of a trapped flux line in the ground plane. Since the moat provides a pinning site for trapping magnetic flux, its width must be sufficiently great that it can trap a fluxoid. The coherence length is known for different materials and is, for example, about 500 angstroms for lead.

The moat will be very effective in eliminating trapped flux if the ambient field is such that the total flux penetrating the guarded area is less than about one flux quantum, and if the ground plane connections 26 are narrow enough so that any flux from outside the moat which moves into the connections will get trapped by the moat rather than pass through into the guarded region. This requirement will be met if the width of the moat (cut) is less than a few effective superconducting penetration depths in the temperature region near $T_c$ where the mixed state becomes established; for typical thin-film ground planes, this means that the width of the connections should be on the order of 5–10 micrometers or less. In practice, the width will be determined by the lithography that is used, and will typically be on the order of microns. In the case of a 2.5 micrometer holey interferometer of the type shown, the connections 26 can have a width of approximately 2.5 micrometers. The moat provides a favorable pinning site for flux which would try to enter the device area from outside the moat. Thus, the moat prevents the establishment of trapped magnetic flux in the device area, even if the device is a holey interferometer of the type shown herein, which is relatively susceptible to trapped flux.

The moat is used around any flux sensitive device. For example, it can be used around interferometers, or memory cells, or logic circuits. Typically it would be used around each device that is sensitive to trapped flux. Although the moat generally extends through the depth of the ground plane, it need not do so to retain at least partial effectiveness. For example, the moat will still be an effective flux pinning site if its depth is ~50% of the ground plane thickness. Also, if desired, it is possible to further decrease the chance that any flux could pass from outside the guarded area to inside via the connections 26 reducing their thickness relative to the remainder of the ground plane.

In general the moat can be made of any material, including an insulator, whose critical temperature is lower than that of the ground plane. Thus, the moat region will be normal when the ground plane becomes superconducting, thus providing a favorable flux trapping site. The connecting pieces in the moats are necessary to provide a ground plane continuity if the moat is made of a non-superconducting material.

Having thus described our invention, what we claim as new, and desire to secure by Letters Patent is:

1. A superconductive circuit, comprising:
   a continuous superconducting ground plane located on a substrate,
   a superconductive circuit device located near said ground plane, said device being susceptible to magnetic flux trapped in said ground plane,
   said ground plane being characterized by a cut therein, said cut extending along a perimeter surrounding said device and being continuous except for at least one small region where there is no cut, said small region being a path connecting the ground plane within the cut to the ground plane external to the cut and providing a path for the flow of electrical current therethrough.

2. The circuit of claim 1, where said cut has a width which is at least equal to the coherence length of the material comprising the superconducting ground plane.

3. The circuit of claim 1, where said superconductive device is a Josephson device.

4. The circuit of claim 1, where the width of said small region is less than 10 micrometers.

5. The circuit of claim 1, where the thickness of said small regions is less than the thickness of the remainder of the ground plane.

6. The circuit of claim 1, where said cut defines a potential well for trapping magnetic flux in said ground plane.

7. The circuit of claim 1, where the said moat perimeter is such that coupling of the flux trapped in said moat to said device is less than about 1%.

8. The circuit of claim 1, further including a current carrying line extending to said superconductive device and passing over at least one of said small regions where there is no cut, and current carrying control lines for providing control signals to said device, said control lines crossing said cut.

9. A superconductive circuit, comprising:
   a superconductive ground plane,
   a superconductive circuit device located near aid ground plane, said device being susceptible to magnetic flux trapped in said ground plane, said ground plane including a narrow moat therein for providing a potential well for trapping magnetic flux in a specific region of said ground plane, said potential well extending along a perimeter substantially surrounding said device.

10. The circuit of claim 9, where said moat is comprised of a material which has a critical temperature, below which it becomes superconducting, less than the critical temperature of the material comprising the ground plane.

11. The circuit of claim 9, where said device is a Josephson interferometer.

12. The circuit of claim 9, where said potential well is located in a perimeter substantially surrounding said device, said perimeter being sufficiently far from said device that the coupling of magnetic flux trapped in said potential well to said device is less than about 1%.

13. The circuit of claim 9, wherein said device is a device exhibiting a Josephson tunneling current, said potential well including means for preventing magnetic flux from entering the area of the superconducting ground plane under said device, said potential well surrounding an area containing less than one half the magnetic flux quantum.

14. The circuit of claim 9, where said moat is a narrow cut in said ground plane having a width at least as great as the coherence length of said superconducting ground plane.

15. The circuit of claim 10, where said moat is discontinuous, having small regions along its length where said ground plane material is continuous and joins the area of the ground plane inside and outside of said moat.

16. The circuit of claim 15, where said device is a device exhibiting a Josephson current.

17. The circuit of claim 15, where the width of said moat is at least as great as the coherence length of said superconducting ground plane.

* * * * *